US009448597B2

(12) United States Patent
Cox et al.

(10) Patent No.: US 9,448,597 B2
(45) Date of Patent: Sep. 20, 2016

(54) ELECTRONIC DEVICE WITH SERVICEABLE CPU (71) Applicant: Lenovo Enterprise Solutions (Singapore) Pte. Ltd., Singapore (SG)

(72) Inventors: Aaron R. Cox, Tucson, AZ (US); Zhen De Fu, Shanghai (CN); Lei R. Li, Shanghai (CN); Jason E. Minyard, Phoenix, AZ (US); Joni E. Saylor, Phoenix, AZ (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 236 days.

(21) Appl. No.: 14/028,655

(22) Filed: Sep. 17, 2013

(65) Prior Publication Data

US 2015/0077931 A1    Mar. 19, 2015

(51) Int. Cl.
G06F 1/18    (2006.01)
H05K 7/14   (2006.01)
G06F 1/20    (2006.01)
H01L 23/40   (2006.01)

(52) U.S. Cl.
CPC .............. *G06F 1/181* (2013.01); *G06F 1/183* (2013.01); *G06F 1/20* (2013.01); *H01L 23/4006* (2013.01); *H05K 7/1401* (2013.01); *H05K 7/1431* (2013.01); *H01L 2023/4081* (2013.01); *H01L 2023/4087* (2013.01); *H01L 2924/0002* (2013.01); *Y10T 29/4913* (2015.01)

(58) Field of Classification Search
None
See application file for complete search history.

(56) References Cited

U.S. PATENT DOCUMENTS 5,673,174 A    9/1997   Hamirani
6,724,628 B2   4/2004   Franz et al.
(Continued)

FOREIGN PATENT DOCUMENTS

DE    20300103 U1    3/2003
FR    2949006 A3     2/2011
(Continued)

OTHER PUBLICATIONS

Fan, Shu-Kai S., et al; "Disassembly and recycling cost analysis of waste notebook and the efficiency improvement by re-design process." Journal of Cleaner Production (2012).
(Continued)

*Primary Examiner* — Courtney Smith
(74) *Attorney, Agent, or Firm* — Katherine S. Brown; Andrew M. Calderon; Roberts Mlotkowski Safran Cole & Calderon, P.C.

(57) ABSTRACT

An electronic device includes an opening in a cover, a sleeve extending from the opening to a circuit board, and a CPU assembly. The CPU assembly includes a CPU carrier and is insertable into the sleeve to connect the CPU carrier with a CPU connector upon the circuit board. A method of installing the CPU assembly into the electronic device includes inserting the CPU assembly into a an opening in a cover of the electronic device within a sleeve extending from the opening to a circuit board. A serviceable CPU assembly includes a CPU carrier thermally connected to an underside of a lower portion of a heat sink, a CPU assembly base including a plurality of guidance features to properly align CPU assembly during installation, and a handle assembly comprising at least one handle connected to an upper portion of the heat sink.

18 Claims, 6 Drawing Sheets

(56) References Cited

U.S. PATENT DOCUMENTS

| | | | |
|---|---|---|---|
| 7,969,738 B2* | 6/2011 | Koo | 361/701 |
| 8,081,470 B2* | 12/2011 | Oki et al. | 361/715 |
| 8,451,622 B2* | 5/2013 | Yu | 361/800 |
| 9,066,447 B2* | 6/2015 | Klum et al. | |
| 2003/0092305 A1 | 5/2003 | Takeuchi | |
| 2004/0134639 A1 | 7/2004 | Franke et al. | |
| 2005/0022969 A1 | 2/2005 | Chen et al. | |
| 2008/0043445 A1 | 2/2008 | Xia et al. | |
| 2008/0259555 A1* | 10/2008 | Bechtolsheim | G06F 13/409 361/679.4 |
| 2009/0034205 A1 | 2/2009 | Li et al. | |
| 2012/0113599 A1* | 5/2012 | Yonemochi | 361/719 |
| 2012/0300407 A1* | 11/2012 | Yamamoto | 361/715 |
| 2014/0235080 A1* | 8/2014 | Cox | H05K 3/30 439/136 |

FOREIGN PATENT DOCUMENTS

| | | |
|---|---|---|
| JP | 2005191473 | 7/2005 |
| TW | 1316387 | 10/2009 |

OTHER PUBLICATIONS

Sorensen, P. L. et al; "Konti-Skan 1 HVDC Pole Replacement." CIGRE, B4-207, Session (2004).

Chinese Office Action dated Apr. 8, 2016 in related Application No. 10520424290, 6 pages.

* cited by examiner

ELECTRONIC DEVICE WITH SERVICEABLE CPU

FIELD

Embodiments of invention generally relate to electronic enclosures, and more particularly to an electronic device with a serviceable central processing unit (CPU).

DESCRIPTION OF THE RELATED ART

A CPU is the hardware (e.g. processor, etc.) within a electronic device (e.g. computer, server, appliance, etc.) that carries out the instructions of a program by performing the basic arithmetical, logical, and input/output operations of the system.

CPU's are typically mounted to a circuit board, mother board, system board, etc. and have a low profile compared to other device components. Therefore, CPUs tend to be covered with only limited access. To access CPUs, users are required to remove a cover of the electronic device, remove other device components, etc. These operations are typically performed by a trained person or advanced users whom utilize complex installation/removal tools and other equipment (e.g. ESD grounding straps, etc.).

SUMMARY

Embodiments of invention generally relate to electronic enclosures, and more particularly to an electronic device with a serviceable central processing unit (CPU).

In a first embodiment, an electronic device includes an opening in a cover, a sleeve extending from the opening to a circuit board, and a CPU assembly. The CPU assembly includes a CPU carrier and is insertable into the sleeve to connect the CPU carrier with a CPU connector upon the circuit board.

In another embodiment, method of installing the CPU assembly into the electronic device includes inserting the CPU assembly into a channel of the electronic device. The channel includes an opening in a cover of the electronic device and a sleeve extending from the opening to a circuit board.

In yet another embodiment, a serviceable CPU assembly includes a CPU carrier thermally connected to an underside of a lower portion of a heat sink, a CPU assembly base including a plurality of guidance features to properly align CPU assembly during installation, and a handle assembly comprising at least one handle connected to an upper portion of the heat sink.

These and other embodiments, features, aspects, and advantages will become better understood with reference to the following description, appended claims, and accompanying drawings.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Details of the claimed embodiments are disclosed herein. However, it is understood that the disclosed embodiments are merely illustrative of the structures, devices, systems, methods, etc. that may be embodied in various forms. These exemplary embodiments are provided so that this disclosure will be thorough and complete and will convey the scope of this invention to those skilled in the art. In the description, details of well-known features and techniques may be omitted to avoid unnecessarily obscuring the presented embodiments.

Figure 1:
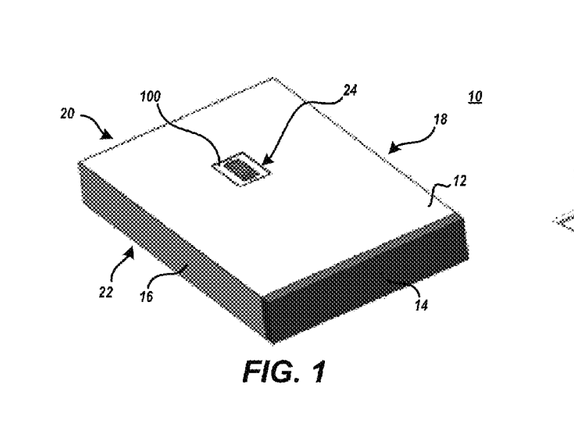
FIG. 1 and FIG. 2 depict an electronic device and a serviceable CPU assembly, according to various embodiments of the present invention.

FIG. 1 depicts an electronic device 10 that includes a serviceable CPU assembly 100, according to various embodiments of the present invention. In certain embodiments, electronic device 10 may also include a top cover 12, front cover 14, left cover 16, right cover 18, back cover 20, and/or bottom cover 22. In accordance with various embodiments of the present invention, at least one electronic device 10 cover includes an opening 24 to access CPU assembly 100. In certain embodiments, opening 24 is located on a particular electronic device 10 cover that is parallel and above circuit board 30. For example, top cover 12 may include opening 24. Serviceable CPU assembly 100 is serviceable because it is accessible without the removal of an electronic device 10 cover.

Figure 2:
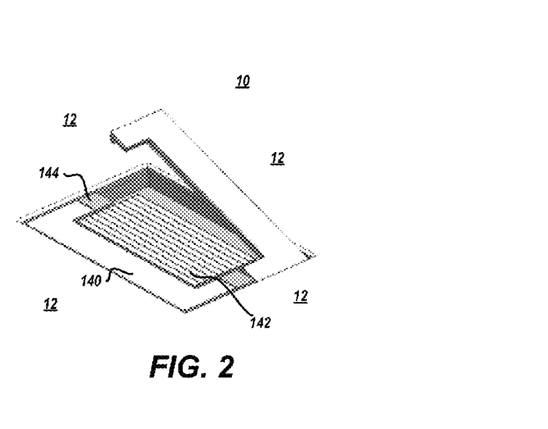

FIG. 2 depicts electronic device 10 and serviceable CPU assembly 100, according to various embodiments of the present invention. In certain embodiments, serviceable CPU assembly 100 may be installed into electronic device 10 and removed from electronic device 10 via opening 24. When serviceable CPU assembly 100 is installed into electronic device 10, a top surface of the serviceable CPU assembly 100 may be substantially coplanar with the electronic device 10 cover that includes opening 24. For example, top surfaces 140, 142, 144, etc. of serviceable CPU assembly 100 components are substantially coplanar with top surface 12 upon installation.

Figure 3:
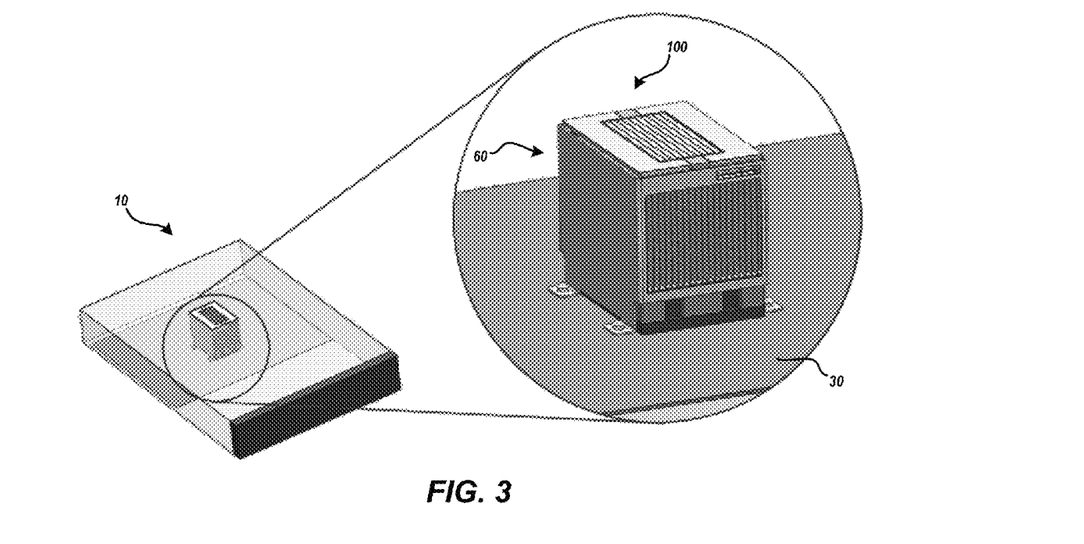
FIG. 3 depicts a serviceable CPU assembly installed within an electronic device, according to various embodiments of the present invention.

FIG. 3 depicts serviceable CPU assembly 100 installed within electronic device 10, according to various embodiments of the present invention. In certain embodiments, electronic device 10 includes a circuit board 30 and serviceability components 60. Circuit board 30 may be a printed circuit board, main board, system board, planar board, logic board, etc. and may include and connect various electronic components of the electronic device 10. Serviceability components 60 are those components of circuit board 30 that are used in association with the installation or removal of serviceable CPU assembly 100 and are further described herein.

Figure 4:
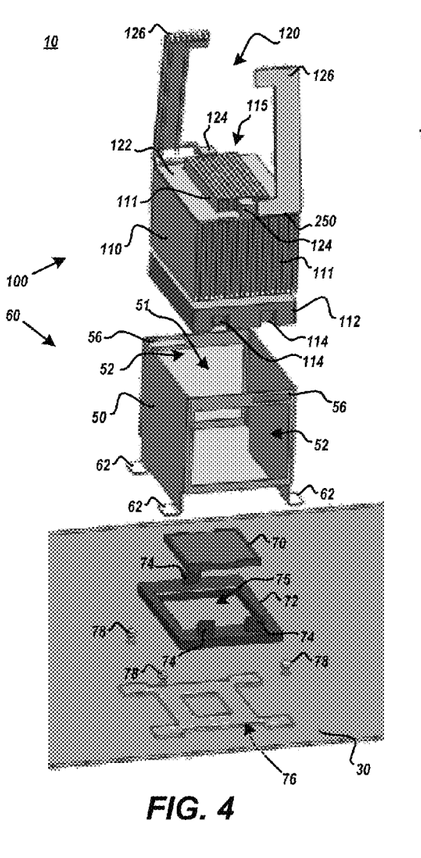
FIG. 4 depicts an exploded view of various components of an electronic device, according to various embodiments of the present invention.

FIG. 4 depicts an exploded view of various components of electronic device 10, according to various embodiments of the present invention. In certain embodiments, electronic device 10 includes circuit board 30, serviceability components 60, and serviceable CPU assembly 100. In certain embodiments, serviceable CPU assembly 100 includes a heat sink 110, CPU assembly base 112, and handle assembly 120.

Heat sink 110 is a heat exchanger that cools the CPU by dissipating heat into the surrounding air and generally increases the surface area in contact with the cooling medium surrounding it, such as the air. In certain embodiments heat sink 110 may be passive and in other embodiments, heat sink 110 may include a fan or other active cooling device. In certain embodiments, heat sink 110 may include fins 111 and heat sink base 117. Heat sink base 117 may thermally contact the upper surface of CPU carrier 200. In certain embodiments, heat sink 110 may include upper fins 113 that extend through an opening 115 of handle assembly 120. In certain embodiments, heat sink 110 may be made of thermally conductive material, such as aluminum or copper.

CPU assembly base 112 includes a plurality of guidance features cam feature 56 that align serviceable CPU assembly 100 so that the interconnects on CPU carrier 200 align with the interconnects of CPU connector 70 prior to fully installing, docking, or seating serviceable CPU assembly 100. In certain embodiments, individual guidance features 114 correspond with individual guidance features 74 to properly align serviceable CPU assembly 100.

Handle assembly 120 includes at least one handle 126 that may be utilized in the insertion or removal of serviceable CPU assembly 100. In certain embodiments multiple handles 126 may be utilized. Handle 126 may include a cam feature 250. Cam feature 250 generally actuates against a fixed leverage point to generate adequate downward force to install serviceable CPU assembly 100 into electronic device 10 or to generate adequate upward force to remove serviceable CPU assembly 100 from electronic device 10. In certain embodiments, cam feature 250 is a tab that actuates against cam feature 56 of sleeve 50. Handle 126 may be attached to handle base 122. Handle base 122 may include at least one attachment tab 124. Attachment tab 124 may be utilized to attach handle 126 to handle base 122 (e.g. a dowel pin may attach handle 126 to handle base 122 by extending through handle 126 and attaching to attachment tab 124, etc.). Attachment tab 124 may include a spring assembly and have push to release handle 126 configuration. For example, when serviceable CPU assembly 100 is installed a user may depress attachment tab 124 whereby the spring assembly rotates handle 126 an adequate angle so that a user may have handle 126 access. Handle base 122 may have a central opening 115 for which upper fins 113 may extend. The components of handle assembly 120 may be made from molded plastic and/or thermally conductive materials. For example, handle base 122 may be machined aluminum, attachment tab 124 may be plastic, and handle 126 may be sheet metal, etc.

In certain embodiments, serviceability components 60 may include sleeve 50, CPU connector 70, guidance apparatus 72, stiffener 76, and/or fasteners 78. Sleeve 50 is generally aligned with opening 24 and includes a channel 51 (e.g. opening, tunnel, etc.) for which to install or remove serviceable CPU assembly 100. In certain embodiments, sleeve 50 has inner and outer front, back, left, and right surfaces. The lack of a top and bottom cover of sleeve 50 may form channel 51. Channel 51 has an inner perimeter that is slightly larger than an outer perimeter of serviceable CPU assembly 100. Sleeve 50 may include one or more air flow openings 52 on generally opposing surfaces. For example, air flow opening 52 may be on the front and back surfaces of sleeve 50 to allow air to flow through heat sink 110. Sleeve 50 may also include one or more cam features 56. Cam features 56 generally provide a fixed leverage point to generate adequate downward force to install serviceable CPU assembly 100 into electronic device 10 or to generate adequate upward force to remove serviceable CPU assembly 100 from electronic device 10. In certain embodiments, cam features 56 are slots within one or more sleeve 50 surfaces. Sleeve 50 may also include one or more connection flanges 62. Connection flanges 62 may be utilized to connect sleeve 50 to circuit board 50 (e.g. fasteners 58 extend through flanges 62 into stiffer 76, etc.). Though connection flanges 62 are shown on the lower portion of sleeve 50, one or more connection flanges may exist on the upper portion of sleeve 50 to allow for the connection of, for example, cover 12 to sleeve 50. In certain embodiments, sleeve 50 extends upward to meet top cover 12 to reduce or limit EMC discharge from electronic device 10. In certain embodiments, sleeve 50 may be made from sheet metal, molded plastic, etc. In certain embodiments, sleeve 50 is installed upon circuit board 30.

CPU connector 70 may be a CPU socket (e.g. pin grid array, ball grid array, etc.) and generally serves to connect a CPU carrier 200 to circuit board 30. CPU connector 70 may include interconnects on the upper side of CPU connector 70 that connect to CPU carrier 200 that are electrically connected to interconnects on the bottom side of CPU connector 70 that connect to circuit board 30. In certain embodiments, CPU connector 70 is installed upon circuit board 30.

Guidance apparatus 72 includes a plurality of guidance features 74 that align serviceable CPU assembly 100 so that the interconnects on CPU carrier 200 align with the interconnects of CPU connector 70 prior to fully installing, docking, or seating serviceable CPU assembly 100. In certain embodiments, guidance features 74 are outside the perimeter of CPU connector 70. In certain embodiments, guidance apparatus includes a central opening 75 for which to connect CPU connector 70 to circuit board 30 there through. In certain embodiments, guidance apparatus 72 may be molded plastic though other materials may be utilized. In certain embodiments, guidance apparatus 72 is installed upon circuit board 30.

Figure 5:
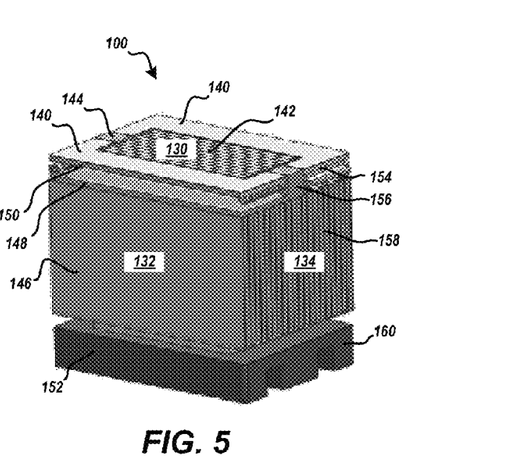
FIG. 5 depicts a serviceable CPU assembly, according to various embodiments of the present invention.

FIG. 5 depicts serviceable CPU assembly 100, according to various embodiments of the present invention. In certain embodiments serviceable CPU assembly 100 includes a top surface 130, front surface 134, and left surface 132. Though multiple components of serviceable CPU assembly exist the dimensions and configuration of those components generally form top surface 130, front surface 134, and left surface 132. For example, top surface 140 of handle 126, top surface 142 of heat sink 110, and top surface 144 of attachment tab 124 are substantially coplanar and form top surface 130. Likewise, left surface 150 of handle 126, left surface 148 of handle base 122, left surface 146 of heat sink 110, and left surface 152 of CPU assembly base 112 are substantially coplanar and form left surface 132. Further, front surface 154 of handle 126, front surface 156 of attachment tab 124, front surface 158 of heat sink 110, and front surface 160 of CPU assembly base 112 are substantially coplanar and form front surface 134. Though not shown, serviceable CPU assembly 100 may also include a right surface, back surface, etc. that are formed by the components of serviceable CPU assembly 100 being coplanar, relative thereto.

Figure 6:
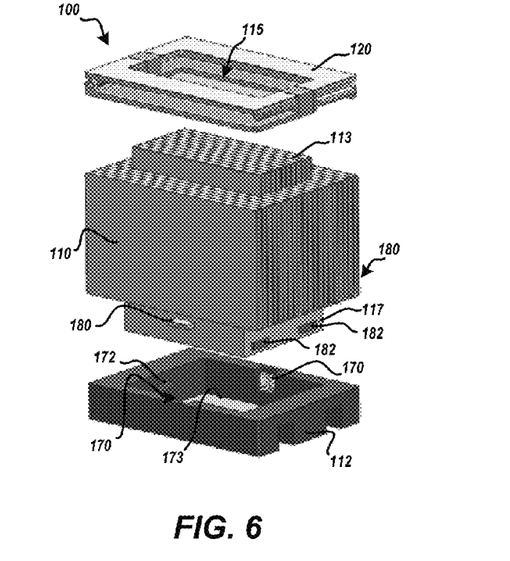
FIG. 6 depicts an exploded view of various components of a serviceable CPU assembly, according to embodiments of the present invention.

FIG. 6 depicts an exploded view of various components of a serviceable CPU assembly 100, according to embodiments of the present invention. In certain embodiments, handle assembly 120 includes a central opening 115. Handle assembly 120 may be attached to heat sink 110 using known techniques. For example handle assembly 120 may be attached to heat sink 110 with fasteners, adhesives, etc. When attached, upper fins 113 of heat sink 110 may extend through opening 115.

In certain embodiments, heat sink base 117 includes a plurality of tabs 180. Tabs 180 extend outwardly from heat sink base 117 and may be accepted by recesses 170 within CPU assembly base 112. Tabs 180 may rest on spring or other floating features within recesses 170. In certain embodiments heat sink base 177 includes protrusions 182. Protrusions 182 extend outwardly from heat sink base 117 and may interfere with a ledge 173 in CPU assembly base 112. Protrusions 182 are generally horizontally movable within respective channels in heat sink base 117. The interference will prevent the serviceable CPU assembly 100 from being fully inserted but will allow serviceable CPU assembly 100 to be installed to a pre-dock installation position. Heat sink base 117 may be inserted into opening 115 of CPU assembly base 112. When installed to CPU assembly base 112, heat sink 110 is prevented from horizontal movement relative to CPU assembly base 112 but may be able to float or have slight movement vertically relative to CPU assembly base 112. The slight vertical movement allows the CPU carrier 200 to fully dock with CPU connector 70 relative to a stationary CPU assembly base 112 when the interference is removed.

In certain embodiments CPU assembly base 112 includes one or more recesses 170 that accept tabs 180. Recesses 170 may include spring or other vertical floating features within recesses 170 that allow limited vertical movement of heat sink 110 relative to CPU assembly base 112. CPU assembly base 112 may also include a central opening 173 that may accept heat sink base 117. Heat sink 110 is generally retained from horizontal movement relative to CPU assembly base 112 upon the acceptance of heat sink base 117 into central opening 173. CPU assembly base 112 may also include one or more slider 172. Slider 172 is generally horizontally movable within respective channels within CPU assembly base 112. Sliders 172 actuate protrusions 182 to remove the interference that results in pre-docking. Once the interference is removed, heat sink 110, still being vertically movable relative to CPU assembly base 112, may continue the downward movement so as to seat CPU carrier 200 onto CPU connector 70. In certain embodiments, sliders 172 may be actuated by guidance features 74 respectively.

Figure 7:
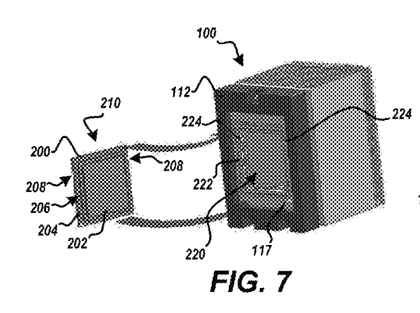
FIG. 7 depicts a serviceable CPU assembly and CPU carrier, according to various embodiments of the present invention.

FIG. 7 depicts serviceable CPU assembly 100 that includes a CPU carrier 200, according to various embodiments of the present invention. Generally, CPU assembly 100 includes a CPU retainer 220 wherein CPU carrier 200 may be installed. In certain embodiments a thermal interface material may be applied to CPU retainer 220 and/or to CPU carrier 200. The thermal interface material generally removes air gaps that may exist at the interface of CPU retainer 220 and CPU carrier 200, thereby increasing the heat transfer from CPU carrier 200 into, for example, heat sink 100. In certain embodiments, CPU retainer 220 is located on the bottom surface of heat sink 110, heat sink base 117, etc. CPU retainer 220 may include an insert 222. Insert 222 may fit within CPU retainer 220 and allows for various size CPU carriers 200 to be installed to CPU assembly 100. For example, there may be various sizes of inserts 222 that correspond to various CPU carriers 220 to allow for small CPU carriers 220 or large CPU carriers 220 to be installed to CPU assembly 100. Generally, the outer perimeter of insert 222 may fit within CPU retainer 220. CPU retainer 220 may include locating features 224 that correspond with locating features 208 on CPU carrier 200. In certain embodiments, CPU retainer 220 is a recess in the bottom surface of heat sink base 117.

CPU carrier 200 generally houses the CPU and may be for example, a chip carrier, etc. CPU carrier may include a substrate 204 having electrical interconnects 210 (e.g. pins, posts, buttons, etc.) on backside 206. A CPU 206 may be installed to the opposing side of substrate 204. A lid 202 may cover CPU 206. When installed, the lid 202 makes thermal contact with heat sink 110 (e.g. thermal grease, or thermal interface material may aid in heat transfer from lid 202 to heat sink 110, etc.). Substrate 204 may have locating features 108 that correspond with locating features 224 so as to orient CPU carrier 200 correctly.

Figure 8:
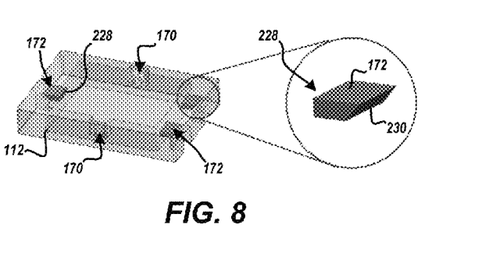
FIG. 8 and FIG. 9 depict various components of a serviceable CPU assembly, according to embodiments of the present invention.

FIG. 8 depict various components of a serviceable CPU assembly 100, according to embodiments of the present invention. More specifically, various components of CPU assembly base 112 are depicted. In certain embodiments, multiple recesses 170 accept multiple tabs 180, respectively. Recesses 170 generally limit horizontal movement of tabs 180, heat sink 110, etc. Recesses 170 may include spring or other vertical floating features within recesses 170 that allow limited vertical movement of heat sink 110. Slider 172 is generally horizontally movable within respective channels within CPU assembly base 112. Sliders 172. In certain embodiments, sliders 172 include a perpendicular face 228 and an oblique face 230. Perpendicular face 228 may actuate protrusions 182 to remove the interference that results in pre-docking. Oblique face 230 may be actuated by guidance feature 74.

Figure 9:
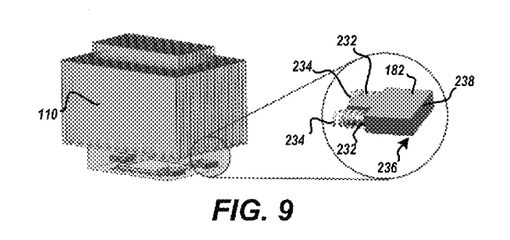

FIG. 9 depict various components of a serviceable CPU assembly 100, according to embodiments of the present invention. More specifically, various components of heat sink 110 are depicted. Protrusions 182 extend outwardly from heat sink base 117 and interfere with ledge 173 in CPU assembly base 112. Protrusions 182 are generally horizontally movable within respective channels in heat sink base 117. The interference will prevent the serviceable CPU assembly 100 from being fully inserted but will allow serviceable CPU assembly 100 to be installed to a pre-dock installation position. In certain embodiments, protrusions 182 may include springs 234. Springs 234 may generally force protrusions 182 to protrude from heat sink base 117. Springs 234 may fit around posts 232. In certain embodiments, an underside 236 of protrusions 182 may interfere with ledge 173 in CPU assembly base 112. In certain embodiments, protrusions 182 include a perpendicular face 238. Perpendicular face 238 may engage with perpendicular face 228 thereby removing the interference that results in pre-docking.

Figure 10:
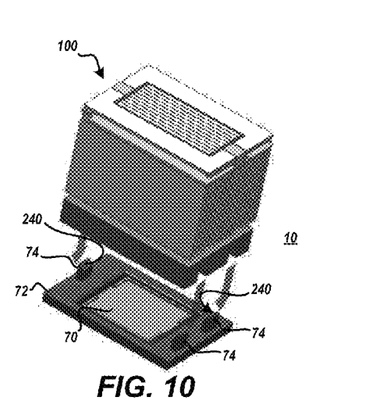
FIG. 10 depict a serviceable CPU assembly being installed within an electronic device, according to various embodiments of the present invention.

FIG. 10 depict a serviceable CPU assembly 100 being installed within an electronic device, according to various embodiments of the present invention. For clarity, FIG. 10 does not depicts some serviceability components 60. In certain embodiments, guidance features 74 include an oblique face 240. Oblique face 240 may engage with oblique face 230 during CPU assembly 100 installation, thereby forcing slider 172 to slide horizontally with respect to CPU assembly base 112. Perpendicular face 228 then engages with perpendicular face 238 and removes protrusion 182 interference that results in pre-docking.

Figure 11:
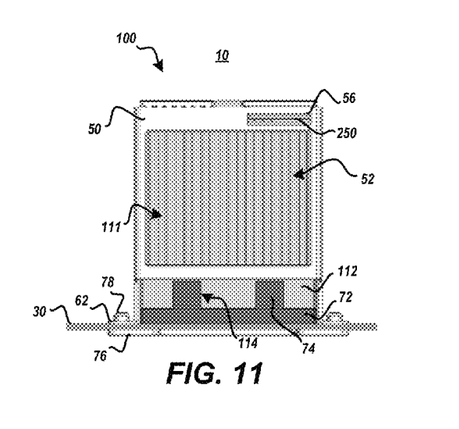
FIG. 11 depicts a serviceable CPU assembly installed within an electronic device, according to various embodiments of the present invention.

FIG. 11 depicts a serviceable CPU assembly 100 installed within electronic device 10, according to various embodiments of the present invention. CPU assembly 100 may be installed within device 10 by rotating one or more handles 126 whereby cam features 250 engage with cam feature 56 fully docking CPU carrier 200 to CPU connector 70. During installation, guidance apparatus 74 may fit within guidance feature 114 thereby aligning CPU assembly 100. When installed, opening 52 allows for air flow provided, for example, by a fan within electronic device 10 to access fins 111.

Figure 12:
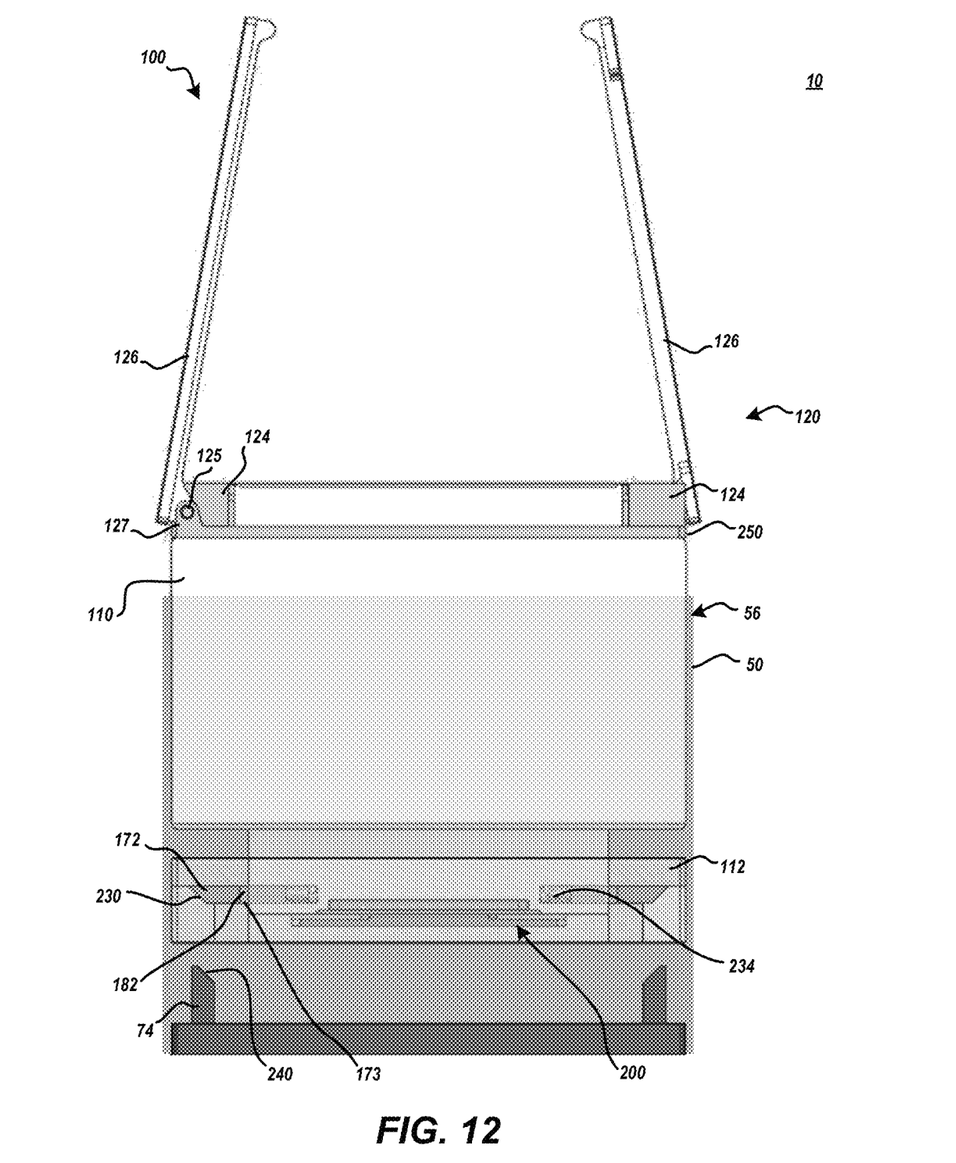
FIG. 12 depicts a serviceable CPU assembly being installed within an electronic device, according to various embodiments of the present invention.

FIG. 12 depicts a serviceable CPU assembly 100 being installed within electronic device 10, according to various embodiments of the present invention. In certain embodiments, serviceable CPU assembly 100 is inserted within opening 24 of electronic device 10. Sleeve 50 and opening 24 generally form a channel for which to insert CPU assembly 100. One or more handles 126 may be utilized by a user to position serviceably CPU assembly 100 to be inserted into the channel. In certain embodiments, handles 126 may rotate relative to CPU assembly 100. For example a dowel pin 125 may extend through handle 126 and attach to handle base 122, attachment tab 124, etc. Handle base 122 may include an attachment portion 127 for which dowel pin 125 may attach. Serviceable CPU assembly 100 may be installed within sleeve 50 to a pre-dock position wherein oblique face 230 contacts oblique face 240 and wherein underside 236 of protrusions 182 contacts ledge 173 of CPU assembly base 112. Also at the pre-dock position, cam features 250 may engage with cam features 56 to allow handles to be rotated further downward. This rotation engages the cam features to generate adequate downward force to install serviceable CPU assembly 100 into electronic device 10.

Figure 13:
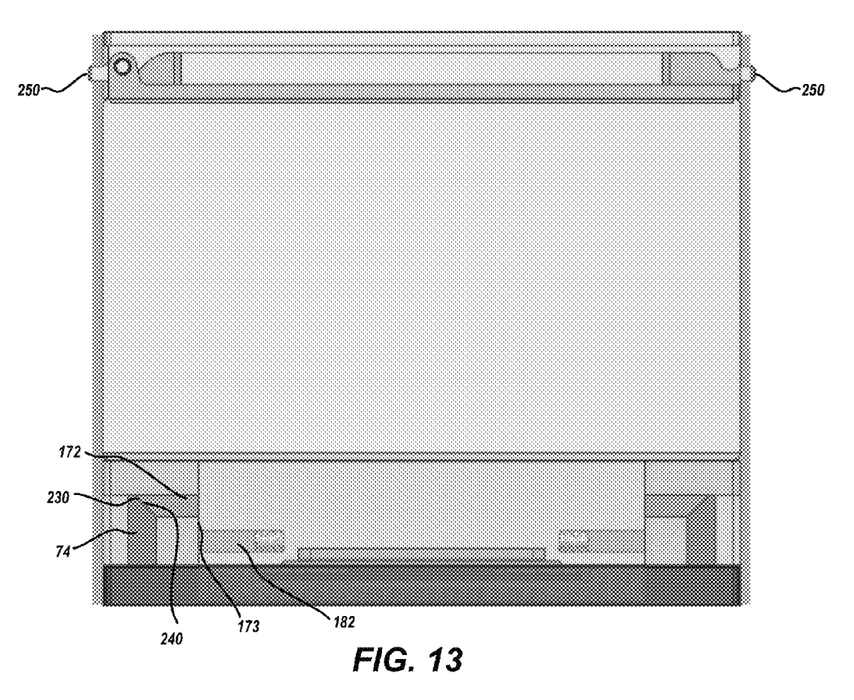
FIG. 13 depicts a serviceable CPU assembly installed within an electronic device, according to various embodiments of the present invention.

FIG. 13 depicts a serviceable CPU 100 assembly installed within an electronic device 10, according to various embodiments of the present invention. More specifically, FIG. 13 depicts serviceable CPU 100 in a docked or seated position whereby CPU carrier 200 is docked, seated, or otherwise installed into CPU connector 70. At the pre-dock position, heat sink 110 floats or has slight movement vertically relative to CPU assembly base 112. Therefore, with continued handle 126 rotation, heat sink 100, CPU carrier 200, handle assembly 120 is forced downward. The interference created by the contact of oblique face 230 and oblique 240 and the downward force created by handle 126 camming forces slider 172 to move inward. The inward movement of slider 172 forces protrusions 182 inward and will eventually force protrusions 182 to move such that perpendicular face 238 becomes generally coplanar with surface 173 of heat sink base 117. In other words, with enough inward movement, protrusions 182 no longer protrude from heat sink base 117. The underside 236 of protrusions 182 no longer interfere with a ledge in CPU assembly base 112, and heat sink 110, CPU carrier 200, handle assembly 120, etc. may continue downward. In certain embodiments, serviceable CPU 100 is in a docked or seated position when CPU carrier 200 is docked, seated, or otherwise installed into CPU connector 70. In certain embodiments, when serviceable CPU assembly 100 is in the docked position, handle 126 upper surface 140 is coplanar with cover 12.

Figure 14:
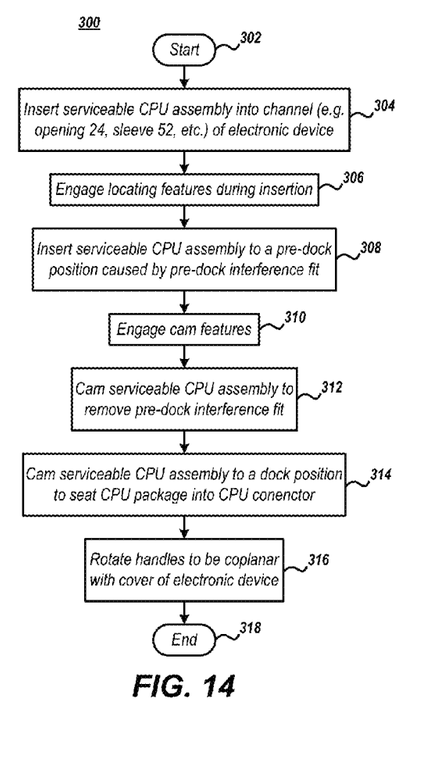
FIG. 14 depicts a block diagram of a process of installing a serviceable CPU assembly into an electronic device, according to various embodiments of the present invention.

FIG. 14 depicts a block diagram of a process 300 of installing serviceable CPU assembly 100 into electronic device 10, according to various embodiments of the present invention. Process 300 begins at block 302 and continues by inserting serviceable CPU assembly 100 into an electronic device 10 channel, tunnel, etc. (block 304) accessible without removing an electronic device 10 cover. For example, serviceable CPU assembly 100 may be inserted into opening 24 of electronic device 10 top cover 12. The electronic device 10 channel may be formed via opening 24 and sleeve 50.

Process 300 continues with engaging locating features (block 306). Locating features may be engaged to position serviceable CPU assembly 100 into proper alignment for CPU carrier seating. For example, one or more guidance features 114 correspond and engage with guidance features 74 to properly align serviceable CPU assembly 100. The serviceable CPU assembly 100 is inserted to a pre-dock position caused by a pre-dock interference fit (block 308). For example, serviceable CPU assembly 100 may be installed to a pre-dock position wherein oblique face 230 contacts oblique face 240.

Process 300 continues with engaging cam features (block 310). For example, cam features 250 may engage with cam features 56. Engaging cam features allow handle 126 to be rotated further downward thereby generate adequate downward force to seat CPU carrier into CPU connector 70. Process 300 continues by camming serviceable CPU assembly 100 to remove the pre-dock interference fit (block 312). For example, with continued handle 126 rotation the downward force created by handle 126 camming forces slider 172 to move inward. The inward movement of slider 172 forces protrusions 182 inward and will eventually force protrusions 182 to move such that perpendicular face 238 becomes generally coplanar with surface 173 of heat sink base 117. In other words, there is enough inward movement to force protrusions 182 to no longer protrude from heat sink base 117. The underside 236 of protrusions 182 no longer interfere with a ledge in CPU assembly base 112, and heat sink 110, CPU carrier 200, handle assembly 120, etc. may continue downward. Process 300 continues with camming serviceable CPU assembly 100 into a dock position to seat CPU carrier 200 into CPU connector 70 (block 314). Process 300 continues by rotating handle 126 to so that handle 126 upper surface 140 is coplanar with cover 12 (block 316). Process 300 ends at block 318.

Figure 15:
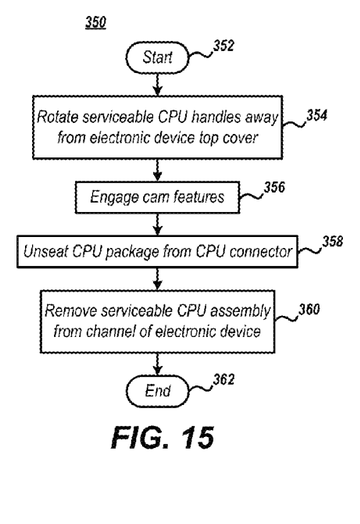
FIG. 15 depicts a block diagram of a process of removing a serviceable CPU assembly from an electronic device, according to various embodiments of the present invention.

FIG. 15 depicts a block diagram of a process 350 of removing serviceable CPU assembly 100 from an electronic device 10, according to various embodiments of the present invention. Process 300 begins at block 352 and continues with rotating CPU assembly 100 handles 126 away from electronic device 10 top cover 12 (block 354). By rotating handles 126 cam features (e.g. cam features 250 engage with cam features 56, etc.) to force CPU carrier 200 to unseat from CPU connector 70 (block 358). Process 350 continues with removing serviceable CPU assembly 100 from electronic device 10 channel without the removal of an electronic device 10 cover (block 360). Process 350 ends at block 362.

The drawings are not necessarily to scale. The drawings are merely schematic representations, not intended to portray specific parameters of the invention. The drawings are intended to depict only exemplary embodiments of the invention. In the drawings, like numbering represents like elements.

The accompanying figures and this description depicted and described embodiments of the present invention, and features and components thereof. Those skilled in the art will appreciate that any particular nomenclature used in this description was merely for convenience, and thus the invention should not be limited by the specific process identified and/or implied by such nomenclature. Therefore, it is desired that the embodiments described herein be considered in all respects as illustrative, not restrictive, and that reference be made to the appended claims for determining the scope of the invention.

References herein to terms such as "vertical", "horizontal", etc. are made by way of example, and not by way of limitation, to establish a frame of reference. The term "horizontal" as used herein is defined as a plane parallel to the conventional plane or surface of the motherboard, regardless of the actual spatial orientation of the motherboard. The term "vertical" refers to a direction perpendicular to the horizontal, as just defined. Terms, such as "on", "above", "below", "side", "top", "bottom", "higher", "lower", "over", "beneath" and "under" are defined with respect to the horizontal plane. It is understood that various other frames of reference may be employed for describing the present invention without departing from the spirit and scope of the present invention.

The invention claimed is:

1. An electronic device comprising:
   an opening in a top cover of the electronic device;
   a sleeve extending from the opening to a circuit board, the circuit board comprising a central processing unit (CPU) connector, and;
   a CPU assembly comprising a CPU carrier, the CPU assembly being insertable into the sleeve to connect the CPU carrier with the CPU connector,
   wherein the CPU assembly is vertically insertable into the sleeve through the opening in the top cover without the removal of the top cover.

2. The electronic device of claim 1 wherein a top surface of the CPU assembly is substantially coplanar with a top surface of the top cover.

3. The electronic device of claim 1 wherein the CPU assembly further comprises:
   a heat sink thermally connected to the CPU carrier.

4. The electronic device of claim 1 wherein the CPU assembly further comprises:
   a handle assembly comprising at least one handle.

5. The electronic device of claim 4 wherein the handle cams against the sleeve to dock the CPU carrier with the CPU connector.

6. The electronic device of claim 1 wherein the CPU assembly is insertable into the sleeve to a pre-dock position and subsequently to a dock position wherein the CPU carrier is docked with the CPU connector.

7. A method of installing a central processing unit (CPU) assembly into an electronic device comprising:
   inserting the CPU assembly into a channel of the electronic device, the channel comprising an opening in a top cover of the electronic device and a sleeve extending from the opening to a circuit board,
   wherein the CPU assembly is vertically inserted into the channel through the opening in the top cover without removal of the top cover.

8. The method of claim 7 further comprising:
   inserting the CPU assembly such that a top surface of the CPU assembly is substantially coplanar with a top surface of the top cover.

9. The method of claim 7 further comprising:
   inserting the CPU assembly to a pre-dock position.

10. The method of claim 7 further comprising:
    inserting the CPU assembly to a dock-position, whereby a CPU carrier comprised in the CPU assembly is docked with a CPU connector comprised on the circuit board.

11. The method of claim 7 further comprising:
    rotating one or more handles of the CPU assembly.

12. The method of claim 11 wherein the handle cams against the sleeve to dock a CPU carrier comprised in the CPU assembly with a CPU connector comprised on the circuit board.

13. A serviceable central processing unit (CPU) assembly comprising:
    a CPU carrier thermally connected to an underside of a lower portion of a heatsink;
    a CPU assembly base comprising a plurality of guidance features to properly align the serviceable CPU assembly during installation, and;
    a handle assembly comprising at least one handle connected to an upper portion of the heat sink,
    wherein the serviceable CPU assembly is configured to be vertically insertable into a sleeve of an electronic device through an opening in a top cover of the electronic device without removal of the top cover.

14. The serviceable CPU assembly of claim 13 wherein the handle assembly further comprises:
    a central opening.

15. The serviceable CPU assembly of claim 14 wherein the upper heat sink portion extends through the central opening.

16. The serviceable CPU assembly of claim 13 wherein a top surface of the handle assembly is substantially coplanar with an upper surface of the heat sink.

17. The serviceable CPU assembly of claim 13 further comprising a CPU retainer configured to receive the CPU carrier.

18. The serviceable CPU assembly of claim 13 wherein the heat sink has limited vertical movement relative to the CPU assembly base.

* * * * *